BEST AVAILABLE COPY

United States Statutory Invention Registration [19]

[11] Reg. Number: H383

Skaritka

[43] Published: Dec. 1, 1987

[54] LAMINATED MAGNET FIELD COIL SHEATH

[75] Inventor: John R. Skaritka, Coram, N.Y.

[73] Assignee: The United States of America as represented by the United States Department of Energy, Washington, D.C.

[21] Appl. No.: 49,909

[22] Filed: May 15, 1987

[51] Int. Cl.[4] ..... H01L 39/24

[52] U.S. Cl. ..... 29/599; 29/605

*Primary Examiner*—John F. Terapane
*Assistant Examiner*—Eric Jorgensen
*Attorney, Agent, or Firm*—Vale P. Myles; Paul A. Gottlieb; Judson R. Hightower

[57] ABSTRACT

A method for manufacturing a magnet cable trim coil in a sheath assembly for use in a cryogenic particle accelerator. A precisely positioned pattern of trim coil turns is bonded to a flexible substrate sheath that is capable of withstanding cryogenic operating conditions. In the method of the invention the flexible sheath, with the trim coil pattern precisely positioned thereon, is accurately positioned at a precise location relative to a bore tube assembly of an accelerator and is then bonded to the bore tube with a tape suitable for cryogenic application. The resultant assembly can be readily handled and installed within an iron magnet yoke assembly of a suitable cryogenic particle accelerator.

5 Claims, 1 Drawing Figure

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

LAMINATED MAGNET FIELD COIL SHEATH

The U.S. Government has rights in this invention pursuant to Contract Number DE-AC02-76CH0016, between the U.S. Department of Energy and Associated Universities Inc.

BACKGROUND

The invention relates to methods for manufacturing precisely wound and positioned magnet coils and, more particularly, relates to such methods for manufacturing superconductor magnet coils that are adapted for use as trim coils in a cryogenic superconducting-super-collider (SSC) particle accelerator having a particle beam path that is encased by a beam tube of relatively small diameter. A superconducting super collider uses thousands of dipole magnets that are carefully designed to exhibit minimal magnetic field harmonics. However, because of superconductor magnetization effects, iron saturation and conductor or coil positioning errors, certain harmonic errors are possible and must be corrected by use of multipole correctors called trim coils. The trim coil assemblies are secured to the beam tube, which comprises an ultra-high vacuum, a (UHV), tube with special strength, size, conductivity and vacuum properties.

At the present time a number of different accelerator magnet systems are being developed for various types of cryogenically cooled particle accelerators. It is anticipated that for accelerators of the SSC type important physics experimentation will be conducted by accelerating different kinds of particles, respectively, in opposite directions in the two intersecting rings of such accelerators; for example, protons may be accelerated in one ring while heavy ions would be accelerated in the other ring. It is recognized that in order to accomplish such experiments, the magnetic field used to accelerate particles in the two rings of such an accelerator must differ significantly. It is also recognized that the accelerator bore diameters in the two rings will be relatively small, i.e., in the range of about 70 to 80 microns. As a consequence, it is necessary in the design and operation of such accelerators to tightly control the flux patterns developed along the particle bores by the accelerator magnets. Typically the construction of such magnets involves stacking a yoke of magnetic iron to surround the accelerator beam tube by a predetermined appropriate diameter. Such a yoke provides a suitable flux return path for the accelerator magnetic field system. In operation, the entire magnet assembly, including the energizing field coils and the magnetic iron yoke assemblies, are encased in a stainless housing that is cryogenically cooled with liquid helium or some other suitable cooling agent.

It has long been known that a desired magnetic flux pattern for accelerating particles through an accelerator bore tube can be fine-tuned or trimmed by precisely positioning a number of magnetic trim coils at selected points along the bore tube surface. The use of such trim coils is, however, significantly complicated in cryogenic accelerator environments due to the problems inherent in inevitable major temperature excursions, as well as those inherent in the use of necessarily very small-diameter superconductor magnetic cable. Another significant manufacturing problem encountered in making suitable trim coils for such superconducting supercollider accelerator assemblies is that the coil windings must extend over several meters in length while maintaining precise close and uniform spacing between adjacent turns of the coils, and at the same time maintaining precise-tolerance spaced relationship of the coil turns relative to the accelerator bore tube, and thus to the associated acceleratror magnet fields.

Whatever means are used to position the trim coils in operating relationship on a bore tube, and to secure the coils in that position, the selected means must be capable of withstanding temperature excursions of several hundred degrees Kelvin. In addition, the coil positioning and securing means must be able to endure the corrosive effects of radiation resulting from movement of accelerated particles around the curved path of the accelerator bores. Finally, mounting a superconducting magnet trim coil in such a precise fashion on the curved, generally cylindrical outer surface of an accelerator beam tube poses other difficult problems in the manufacture and design of suitable methods for making such an assembly. Those problems will be discussed more fully below.

OBJECTS OF THE INVENTION

A primary object of the present invention is to provide a commercially feasible method for manufacturing precisely positioned and securely fastened superconductor magnet trim coil sheath assemblies for use in a cryogenic superconductor-super-collider (SSC) particle accelerator.

Another object of the invention is to provide a method of manufacturing a flexible laminate bearing coils of superconducting insulated magnet cables, which are arranged in predetermined patterns, with the spacing between each turn of the coils being generally uniform over the entire length of the turns, and with the spacing of the coils in the pattern arranged in a precisely predetermined relationship to other magnet coils.

A further object of the invention is to provide a method for manufacturing a flexible trim coil laminate for a SSC magnet assembly wherein the laminate is wrapped around and fixed to a generally cylindrical outer surface of a beam tube in the accelerator.

Yet another object of the invention is to provide a method of manufacturing a cryogenically cooled accelerator beam tube assembly that includes means for precisely positioning a plurality of magnet trim coil patterns in relationship to one another and to the beam tube, prior to assembly of the beam tube into a magnetic yoke assembly of the accelerator.

Additional objects and advantages of the invention will become apparent to those skilled in the art from the description of it contained herein, considered in conjunction with the accompanying drawing.

SUMMARY OF THE INVENTION

Figure 1:
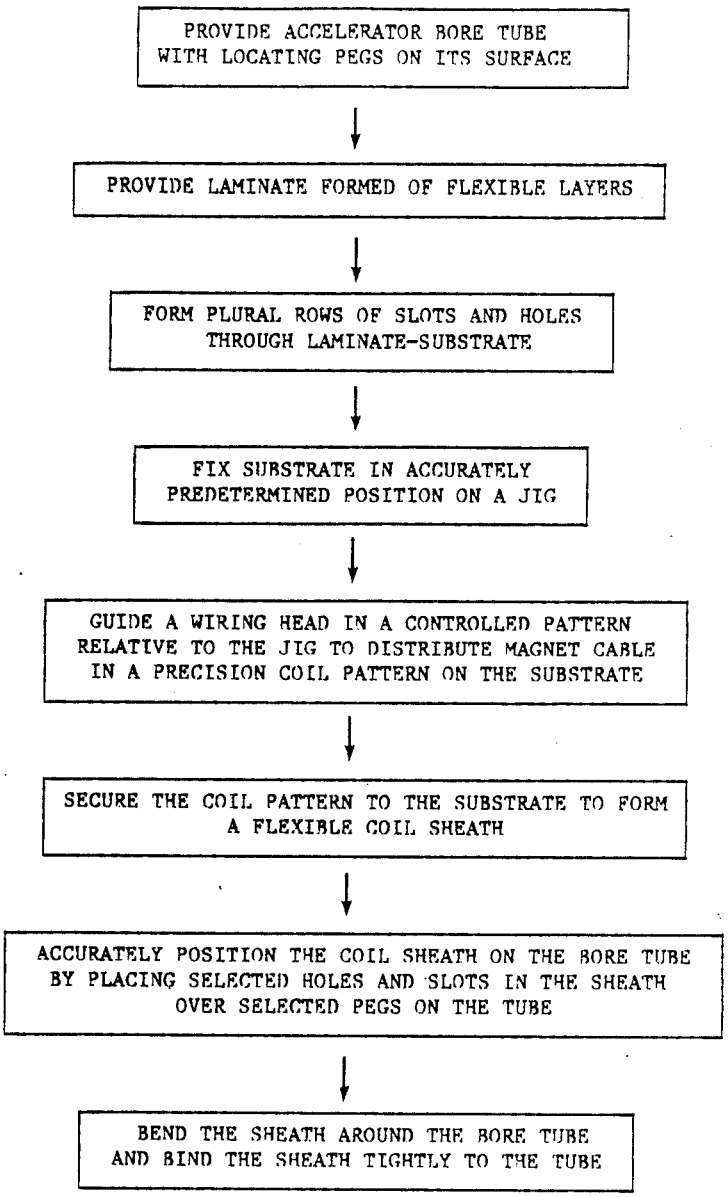
FIG. 1 is a flow chart illustrating characteristic steps of the preferred arrangement of the method of the invention for manufacturing cryogenically cooled magnet trim coil sheaths for use in a superconducting-supercollider particle accelerator.

In a preferred embodiment, the method of the invention is operable to prepare an insulated and flexible laminate having accurately formed coil positioning means thereon. The positioning means are used in the method of the invention to enable precision distribution of a magnet trim coil cable in predetermined patterns on the laminate. After the trim coil is precisely positioned on the laminate, it is affixed in place and covered with a layer of insulation that completes the laminated sheath assembly. Precision locating means are used to precisely position the sheath onto the surface of a beam tube, then the sheath is fixed in position relative to predetermined features of the beam tube.

DESCRIPTION OF THE PREFERRED EMBODIMENT

At the outset, it should be understood that the method of the present invention can be used successfully in forming or manufacturing a number of different types of laminated magnet wire supporting sheaths, in which magnet wires or cables having very small diameters, i.e. diameters in the range of 5 to 10 microns, are employed. By using the preferred mode of the present invention, successful tests of it have been conducted to manufacture super-conducting magnet cable trim coil laminate sheaths in which the coil sides are up to 17 meters in length, while the spacing between adjacent turns of the coils was successfully maintained within a tolerance of a few ten thousandths of an inch relative to a 3 microns spacing over the length of the coil.

In practicing the method of the invention, according to the best mode of it now known, one generally follows the steps outlined in the accompanying drawing, to which reference may now be made. Thus, pursuant to the method, there is first provided a suitable particle accelerator beam tube or bore tube that is constructed of stainless steel or some other conventional material, and that is made with appropriate dimensions to enable it to be mounted in the magnet yoke assembly of such an accelerator. Typically such a beam tube has a generally cylindrically outer surface that is suitable for supporting thereon selected patterns of coiled superconducting magnet cables or thin magnet wires. Obviously, in some such accelerators the configurations of the bore tubes may be of generally helical in cross section or may be some other suitable configuration. As will be seen, such alternative beam tube configurations do not cause undue problems in practicing the method of the present invention.

Next, a special laminated substrate, for making a magnet coil sheath according to the invention, is provided by forming a layer of suitable B-stage epoxy resin in a rectangular pattern that is configured to surround just half of the diameter and a predetermined length of the bore tube. A similarly shaped layer of fiberglass cloth is positioned over the epoxy resin, and a like layer of Kapton insulating resin sheet (Kapton is a trademark of Westinghouse Electric Corporation) is positioned over the fiberglass. Those three layers are bonded together with the epoxy resin curing in place to form the desired flexible laminate. The substrate has to be cryogenically stable, it has to bond to the Kapton-insulated beam tube without distorting the magnet wire positions, and it has to provide good bonding strength for the wires during the wiring, handling and assembly. In the preferred embodiment, the strength and electrical insulation are supplied by a 0.003" thick Kapton sheet. A 0.001" thick FEP teflon coating on one side of the Kapton sheet provides the means of binding the sheet to the bore tube. The other side contains an about 0.002–0.003" matt of fiberglass bonded to the Kapton with a 0.002" thick layer of RC205 adhesive. On top the fiberglass matt is a layer of 0.005" RC205 adhesive for receiving the magnet wires. The matt prevents the adhesive from cracking at liquid nitrogen temperature. The total laminated substrate thickness is only about=0.014". Such material can be processed in 6" strips commercially by the Sheldahl Co. of Northfield, Wis.

In order to provide means for precisely positioning the laminate relative to the bore tube, according to the method of the invention, a plurality of rows of generally circular holes are formed through the substrate at locations precisely predetermined thereon, and a plurality of rows of generally elongated, or rectangular-shaped slots are formed through the substrate at other locations precisely predetermined thereon. The substrate is secured in a fixed position by positioning it in a conventional positioning jig, which includes a number of shaped locating pegs that are arranged to be positioned in a number of the holes and slots formed through the substrate, thereby to precisely position the substrate on the jig. After the substrate is manufactured, the material is slit to a width of 4.346+0.002–0.000" with a straightness of 0.005" over 24 inches. Once thus slit and inspected, the substrate is precision punched with two sets of holes being punched at one inch increments along the length of the substrate. Rectangular-shaped location slots are punched along the substrate at 18 inch increments. The slots and holes are designed to allow a combination of odd or even harmonics from quadruple to 14-pole correction coils. Such correction elements may include for example an 8 meter long 19 turn sextupole, a 5 meter long 12 turn decapole and 4 meter long 14 turn octupole.

Next, in order to precisely position a predetermined number of turns of superconducter magnet cable in a selected pattern on the substrate, while maintaining a substantially uniform spacing between adjacent turns of the coils, and while establishing a precisely predetermined reference relationship between each coil and the respective holes and slots through the laminate, a movable wiring head or machine is guided in a precisely controlled pattern over the laminate as it bonds the superconductor cable onto the substrate. For this purpose, in the preferred embodiment, an ultrasonic wiring head manufactured by Multiwire Division of Kollmorgen Corporation, having offices on Long Island, (N.Y., is used. Such wiring head machines are sold under by the Kollmorgen Corp. In operation, the head ultrasonically vibrates the superconductor cable as it is fed onto the substrate with a RTV epoxy resin dispersed around the cable. As the cable is positioned on the substrate the resin is cured to promptly securely fasten the turns of the coil in a desire pattern that is traced by the wiring head. The pattern traced by the wiring head is tightly controlled by a computer operated arm, or other suitable positioning means that continuously controls the orientation of the wiring head in relation to the jig that accurately positions the laminated substrate. In the preferred embodiment the superconductor wire is insulated with a 1000 volt turn-to-turn breakdown rating. A very thin layer about=0.0002" thick, of High Bond adhesive coats the insulation. The insulated wire is stored in a spool above the wiring head. A small motor on the wiring head drives the wire at a precise speed between a stylus and the substrate adhesive. The stylus is vibrated at about 25 KHz. The kinetic energy imparted to the wire while under the stylus causes the High Bond coating to chemically react with the substrate adhesive, called RC205. The pressure and elevation of the head is varied to control the depth of the wire into the RC205. Wiring speeds are between 8 to 15 meters per minutes.

The hole and slot pattern in the substrate is registered to the wiring head with the use of precision sprockets on a substrate transporter, which is mounted in conventional fashion on the bed of the Multiwire wiring machine. The superconductor wire is applied to the substrate in a predetermined suitable preprogrammed wire pattern.

After the predetermined pattern or patterns of superconductor cable have been secured in position on the substrate, a protective layer of 0.001" thick Kapton insulating film is pressed over the coil pattern in order to secure the respective turns of the coil in position relative to one another, with the desired uniform spacing being maintained along their entire length, thus, a flexible trim coil magnet wire sheath is formed.

It is next necessary to provide means for precisely positioning the trim coil sheath onto an accelerator bore tube. Toward that end a predetermined number of precision locating pegs or pins formed of RX-630 fiberglass, or other suitable insulating material, are precisely positioned, at selected points on the outer surface of the beam tube. The pegs are fastened to the beam tube by suitable conventional means. I have found that this fastening operation can be expedited if the bore tube is first wrapped with a 50%-overlap layer of 1 to 3-mil thick Kapton insulating resin sheet. With such an insulating resin layer in place, the locating pegs or pins can be fastened to the surface of the bore tube by heating the pegs to about 300° C. and pressing them against the layer of Kapton insulation on the tube, thereby to thermally bond the pegs to the Kapton.

The substrate or flexible trim coil sheath is placed on the bore tube, with the respective locating pegs being positioned through predetermined holes or slots in the substrate, thereby to precisely position the substrate and the coil patterns relative to the pegs and to the bore tube. Special tooling is used to roll out and secure the wired substrate onto the beam tube. The location slots in the substrate fit snugly onto one row of location pins bonded to the beam tube. Generally, one such flexible substrate sheath will be mounted on each half of a cylindrical bore tube, thereby to dispose patterns of separate trim coils completely around the tube in predetermined patterns on each half of the tube.

Finally, a double layer of FEP-impregnated Kevlar insulating yarn or tape, (Kevlar is a trademark of Westinghouse Electric Corporation) is wrapped around the flexible substrate sheath and the bore tube, in order to bind the substrate to the bore tube and to aid in securing a desired predetermined alignment of the coil patterns with respect to the bore tube. A final 50% overlap wrap of FEP-coated Kapton film is preferably applied over the Kevlar. The Kapton film assures an electrical breakdown rating greater than about 5 KV between the trim and main coil magnet wires. After the trim coil flexible laminate sheath has been secured to the bore tube, the entire assembly is passed through a radiant oven to heat seal the various components of the assembly together. The location pins protrude through the top Kapton layer. Using the previously mentioned fixtures, locating keys are applied to the location pins and glued into position at 18 inch increments, on both sides of the tube. Bumper strips of G-10 material are glued onto the Kapton outer wrap. These are used to space the beam tube inside the main coil upon assembly. The assembly is then inspected and electrically tested for proper resistance, continuity, inductance and highpot breakdown then it is normally mounted in operating position within a magnetic yoke assembly of an associated cryogenic particle accelerator.

A somewhat more detail understanding of the preferred method of the invention will now be provided by describing at greater length the particular characteristics of the various components used in practicing it to make a finished bore tube assembly. For one such successfully tested prototype, the stainless steel bore tube provided had an outer diameter of about 1.36" with a tolerance of −0.003". That bore tube was wrapped with a 50% overlap of "F" resin film Kapton tape that had a thickness of about 1 mil with a coating of about 0.1 mil of Teflon (a trademark of E.I. DuPont de Nemours Company) on both sides of the Kapton film. As the tape was wrapped around the bore tube it was sealed to the tube at about 300° C. By using that heat sealing method it was found that a good bond is achieved without requiring the use of epoxy or any other adhesive between the bore tube and the Kapton film. Standard machining fixtures were used to precisely position the above-mentioned locating pins or pegs onto the surface of the bore tube at predetermined points. In the prototype embodiment of the invention the locating pegs were molded "R.X. 630" miniature components that are commercially available from E.I. DuPont Company. Those molded miniature components were provided with a Teflon backing that bonds relatively rapidly and securely to the Kapton film on the bore tube, when heated to about 300° C. It will be recognized that the precision location fixture can preferably be securely attached to a long precise flat or plate-like surface, rather than having to be formed in any particular curved configuration analogous to the curvature of the bore tube on which the resultant laminated conductor sheath is to be mounted.

In making the laminate for supporting the superconductor magnet cable, the above-described layers of Kapton film, fiberglass cloth and the Grade B epoxy resin are bonded together with layers of a suitable adhesive, which in the prototype embodiment being described was Kollmorgen's Multiwire 205 adhesive. In the manner explained above, a suitable conventional jig is used to precisely punch and slot the rows of circular holes and elongated slots in the laminate. After the laminate is precisely positioned in the jig by being disposed over a predetermined number of locating pegs or pins on the jig, a desired magnet coil pattern is generated on the substrate by precisely controlling the movement of the Multiwire wiring head as it guides the cable along a preselected computer-controlled pattern. Of course, movement of the head could be manually controlled, but at a penalty in operating time. The laminated substrate upon which the superconductor cable is fastened is moved longitudinally during the pattern-forming step, on a suitable transporter mechanism, such has a roll-up wheel or sleeve that can be either manually or machine operated. Use of such a roll-up device enables very long coil patterns to be produced without requiring an abnormally long table to support the full length of the laminate in a flat position during the cable distributing and bonding process. The transverse position of the cable relative to the moving substrate is controlled by a precision, numerically controlled positioning table of suitable commercial sign, upon which the Multiwire wiring head is mounted for precisely controlled positioning. After the pre-programmed wire pattern is bonded to the substrate, a 1 mil thick layer of Kapton film is positioned over the coiled cable pattern to serve as an extra layer of insulation. Of course, the respective wires in the cable pattern are also provided with their own layer of insulation, as is well known in the superconductor magnet coil manufacturing art.

Normally, after the coil pattern is thus bonded to the substrate, the coil is electrically inspected for continuity and desired electrical resistance characteristics, then the coil sheath is mounted over the locating pegs affixed to the bore tube so that the pegs serve to precisely position the substrate relative to the tube. Preferably the substrate is at least temporarily glued to the tube, but that is not a necessary practice in every application of the invention. Next, the substrate is securely wrapped tightly around the curvature of one side of the bore tube and the edges of the substrate are secured to the bore tube with Kapton tape. Subsequently, Kevlar film impregnated with Teflon powder is wrapped around the substrate and the bore tube. The entire trim coil assembly is then passed through an oven and heated to about 300° C. to bond the substrate sheath assembly to the Kevlar film. After completely mounting the Kevlar layer, the bore tube assembly is placed in the particle-beam bore of a suitable accelerator. Spacer means, such as insulated bumpers, are usually mounted on the tube prior to its insertion into the bore so that the trim coil assembly can be inserted concentrically into the bore of the magnet yoke assembly without damaging the coil. Also, such bumpers maintain a controlled cooling gap between the bore tube assembly and the magnet yoke iron, as is well known in the cryogenic magnet assembly art.

It should be apparent to those skilled in the art that various modifications in, and improvements of, the invention may be made without departing from the scope of the following claims.

I claim:

1. A method of making a superconductor magnet trim coil assembly mounted on a bore tube for use in a superconductor supercollider particle accelerator, comprising the steps of;

providing a particle accelerator bore tube having a generally cylindrically outer surface for supporting thereon selected patterns of coiled superconductor magnet cable, providing a laminated substrate formed of a layer of B-grade epoxy resin, a layer of fiberglass cloth and a layer of insulating resin tape, all of which are compatible with a cryogenic environment, forming a plurality of rows of generally circular holes through said substrate, at locations precisely predetermined thereon, and forming a plurality of rows of generally rectangular slots through said substrate, at locations precisely determined thereon, positioning precisely a predetermined number of coils of insulated superconductor cable in a selected pattern on the substrate with a substantially uniform spacing being maintained between adjacent turns of the coils, and with a precisely predetermined reference relationship being established between each coil and said holes and slots, pressing a layer of resin insulating tape over the coil pattern to secure the respective turns of the coils in the pattern in position relative to one another and to the substrate, positioning precisely a number of locating pegs at selected points on the surface of the bore tube and fastening said pegs to the bore tube surface at said points, respectively, placing the substrate on said bore tube, with the respective locating pegs being positioned through predetermined holes or slots in the substrate, thereby to precisely position the substrate and coil pattern relative to the pegs and to the bore tube, wrapping a layer of resin insulating tape around the substrate and the bore tube, and heating the resin tape and bore tube sufficiently to bond the substrate to the tape and aid in securing the predetermined alignment of the turns of the coil pattern with respect to the bore tube.

2. An invention as defined in claim 1 wherein said rows of generally circular holes and rows of generally rectangular slots are substantially parallel to one another and extend parallel to the major axis of the substrate.

3. An invention as defined in claim 2 wherein said rows of generally rectangular slots comprise at least two rows and are operable to enable smooth curvature of the substrate around the bore tube, thereby to prevent creasing of the substrate assembly.

4. An invention as defined in claim 3 wherein at least four of the generally circular holes are positioned around respective locating pegs that are bonded to the bore tube.

5. An invention as defined in claim 1 including the step of wrapping a 50%-overlapped layer of resin tape around the bore tube and sealing the tape to the bore tube by heating it to about 300° C.

* * * * *